US007027943B2

(12) United States Patent
Steinkirchner et al.

(10) Patent No.: US 7,027,943 B2
(45) Date of Patent: Apr. 11, 2006

(54) METHOD, DEVICE, COMPUTER-READABLE STORAGE MEDIUM AND COMPUTER PROGRAM ELEMENT FOR THE COMPUTER-AIDED MONITORING OF A PROCESS PARAMETER OF A MANUFACTURING PROCESS OF A PHYSICAL OBJECT

(75) Inventors: Erwin Steinkirchner, Straubing (DE); Jörn Maeritz, Zeiler/Nittendorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/712,418

(22) Filed: Nov. 12, 2003

(65) Prior Publication Data

US 2005/0004827 A1    Jan. 6, 2005

(30) Foreign Application Priority Data

Nov. 12, 2002    (DE) ............................... 102 52 606

(51) Int. Cl.
*G06F 19/00*    (2006.01)
*G01N 37/00*    (2006.01)

(52) U.S. Cl. ................. 702/81; 702/117; 702/182; 700/110; 700/121

(58) Field of Classification Search ............ 702/81–84, 702/117–121, 123, 179, 180, 181–185, 187; 700/108–111, 117, 121; 438/14
See application file for complete search history.

(56) References Cited

U.S. PATENT DOCUMENTS

| 5,586,041 A |   | 12/1996 | Mangrulkar ................ 700/24 |
| 5,726,920 A | * | 3/1998  | Chen et al. ................ 702/108 |
| 6,700,950 B1 | * | 3/2004 | Pellegrini et al. ............ 378/34 |
| 2002/0055194 A1 |  | 5/2002 | Takanabe ................... 438/14 |

FOREIGN PATENT DOCUMENTS

GB    2 283 116 A    4/1995

OTHER PUBLICATIONS

Copy of European Search Report dated Mar. 10, 2004 for European Patent Application No. 03026035.
C. Schneider et al., "Automated Photolithography Critical Dimension Controls In a Complex, Mixed Technology, Manufacturing Fab", IBM Microelectronics, 2001 IEEE/SEMI Advanced Semiconductor Manufacturing Conference.

* cited by examiner

*Primary Examiner*—Marc S. Hoff
(74) *Attorney, Agent, or Firm*—Brinks Hofer Gilson & Lione

(57) ABSTRACT

In the case of the method for the computer-aided monitoring of process parameters of a manufacturing process of a physical object, object data which identify the physical object are assigned to various hierarchical levels, object data of various hierarchical levels are grouped to form hierarchical object data records, limit values for at least one process parameter are stored and respectively assigned to a hierarchical object data record, process data of the at least one process parameter, measured during the manufacture of physical objects, are stored and the hierarchical object data records corresponding to the object data are determined for physical objects manufactured.

13 Claims, 5 Drawing Sheets

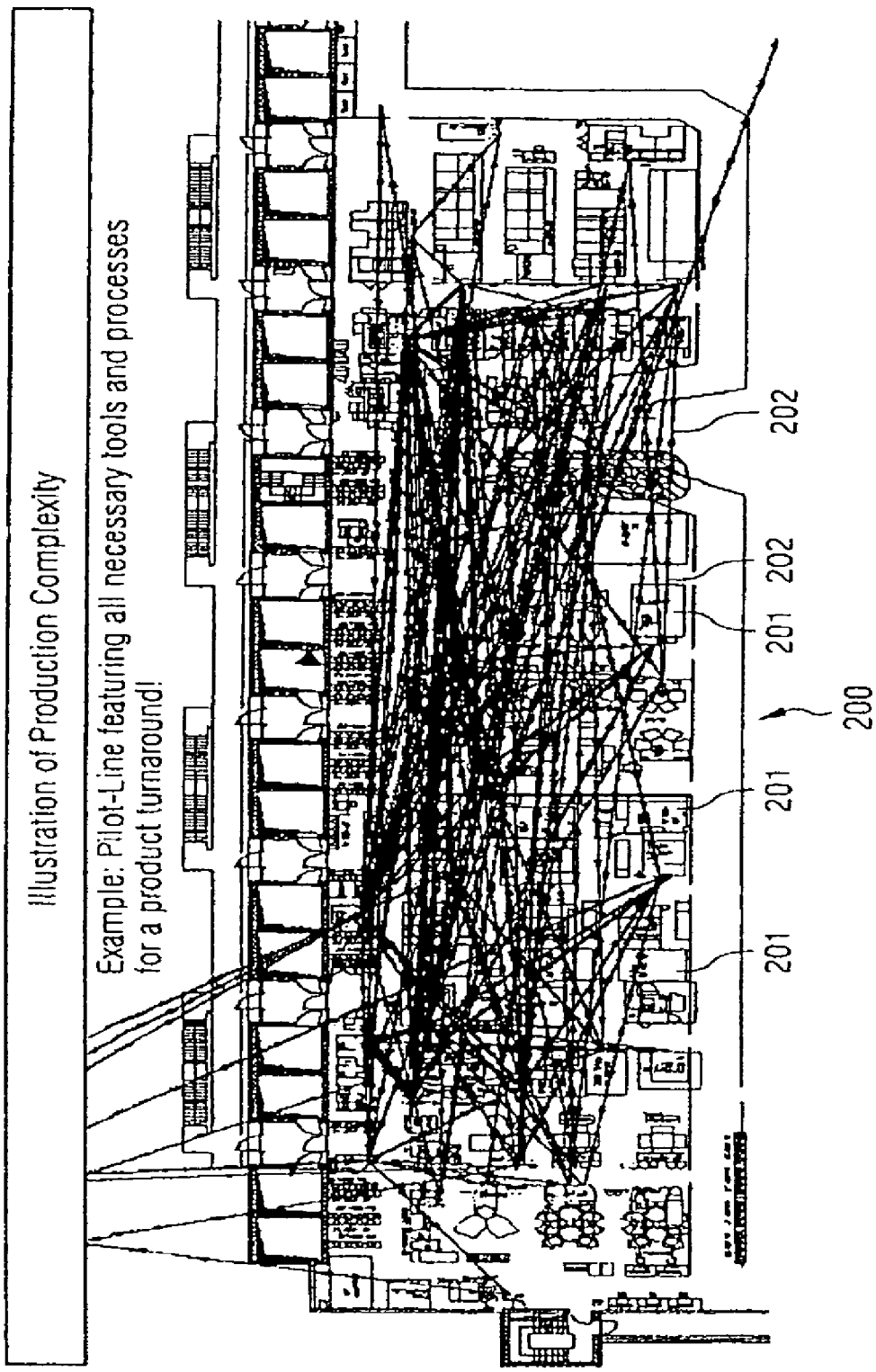

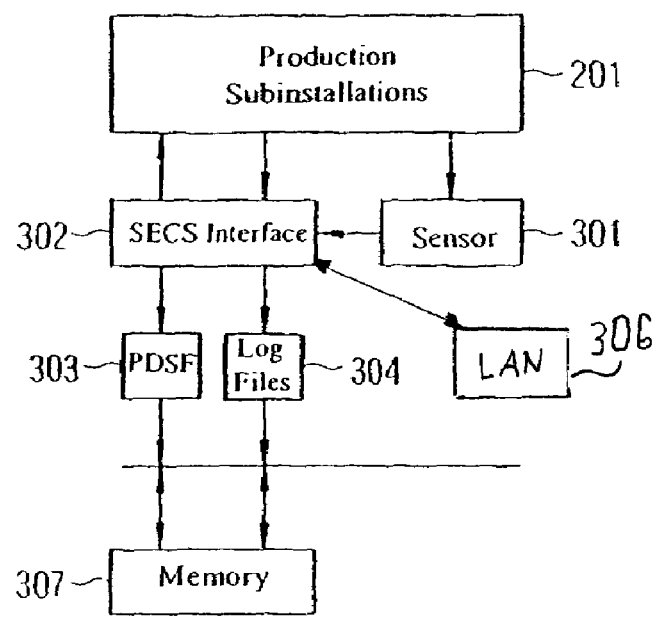
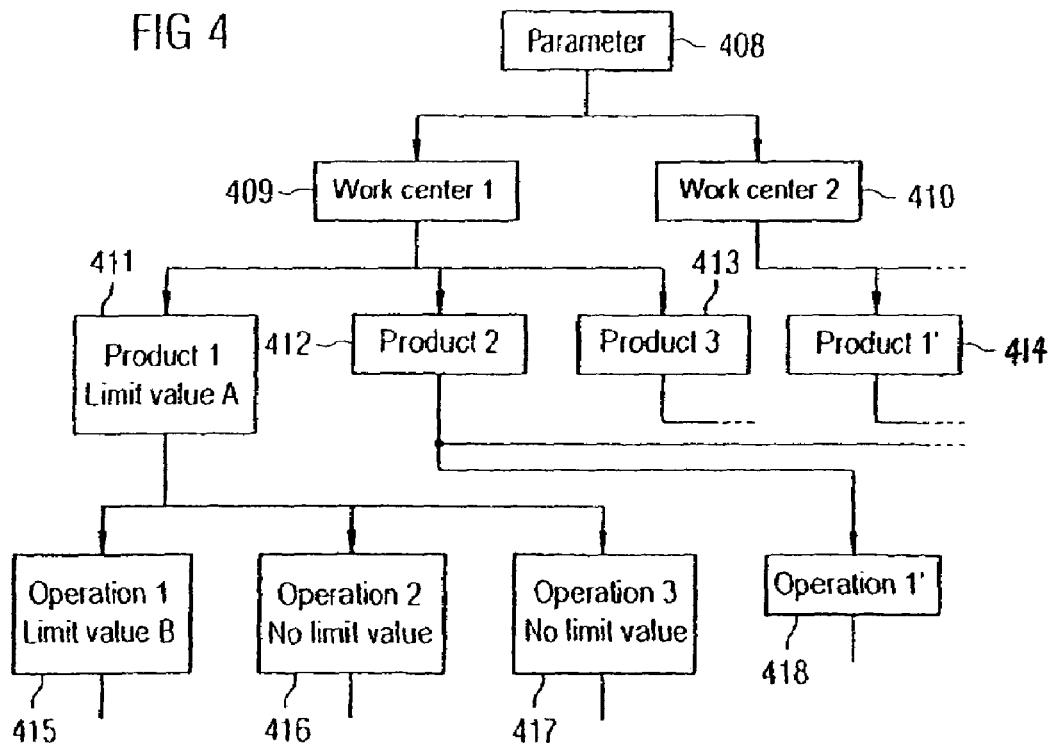

FIG 5

| Parameter | Work center | Product | Operation | Machine | Formu-lation | Layer | Lower limit value | Upper limit value |
|---|---|---|---|---|---|---|---|---|
| Misaligned | Photo g-line | * | * | * | * | * | | 2.5 |
| Misaligned | Photo g-line | SFET2 | * | * | * | * | | 8.0 |
| Misaligned | Photo g-line | SFET2 | 6731 | * | * | * | | 6.0 |
| Misaligned | Photo g-line | SFET2 | 5266 | * | * | * | | 5.0 |
| Misaligned | Photo g-line | B6HFC | * | * | * | * | | 4.0 |
| Misaligned | Photo g-line | B6HFC | 3771 | * | * | * | | 5.0 |
| Misaligned | Photo g-line | B6HFC | 2571.5266 | 121 | * | * | | 6.5 |
| Misaligned | Photo g-line | B6HFC | 2571.5266 | * | * | * | | 4.0 |
| Misaligned | Photo g-line | B6HFC | * | * | L071F | * | | 8.0 |

METHOD, DEVICE, COMPUTER-READABLE STORAGE MEDIUM AND COMPUTER PROGRAM ELEMENT FOR THE COMPUTER-AIDED MONITORING OF A PROCESS PARAMETER OF A MANUFACTURING PROCESS OF A PHYSICAL OBJECT

FIELD OF THE INVENTION

The invention relates to a method, a device, a computer-readable storage medium and a computer program element for the computer-aided monitoring of a process parameter of a manufacturing process of a physical object.

BACKGROUND OF THE INVENTION

In general, semiconductor chips are manufactured several at a time on wafers. These wafers are in turn grouped together to form so-called lots, in which a multiplicity of individual wafers are grouped together for further handling of the wafer object data.

In the manufacture of wafers with highly integrated semiconductor chips, the ever-increasing miniaturization of the structures on the semiconductor chip is responsible in particular for imposing ever greater requirements on the production installations and manufacturing processes used for the manufacture of the semiconductor chips. The stability and reproducibility both of the production installations and of the manufacturing processes decisively influence the yield and productivity during semiconductor chip production. Even small deviations from a prescribed form of behavior of a chip production installation during production can lead to considerable worsening of the yield (i.e. a considerable increase in the defect rate of the semiconductor chips manufactured).

For quality management (i.e. to ensure the quality of the manufacturing process and the quality of the wafers) the wafers must be subjected to test measurements once processing of them has been completed. In order to monitor and assess the manufacturing process completely, it would in fact be necessary to test each individual wafer that has been produced by means of the manufacturing process and subsequently assess the quality of the wafer for a complete and exact determination of the product quality of the wafers of a lot. This is not possible, however, on account of the time-intensive and cost-intensive test measurements for determining the quality of the wafers.

For quality management, a "Statistical Process Control" (SPC) method is often used. According to this method, wafers selected as random samples are tested for their quality by means of test measurements and, on the basis of the results of the investigations of the random samples, the product quality of entire lots of a manufacturing process is determined. The random samples are in this case taken randomly from the wafers of a lot. By means of this SPC method, the average quality of the wafers of a lot or of a manufacturing process is determined.

In quality management it is necessary not only to determine the average quality of the wafers of a lot but also to segregate wafers which are of a low quality and consequently do not meet a prescribed quality limit. These wafers are then sent for special treatment, i.e. for a special measurement, possible re-working or segregation. For this purpose it is necessary to determine those wafers of a lot that are at risk of not meeting the prescribed quality limit because faults occurred during their processing in the manufacturing process. For this purpose, the so-called "Fault Detection and Classification" (FDC) method is often used. By means of this method, process faults, i.e. faults which have occurred in the manufacturing process, are registered. The corresponding defects are also referred to in the application as FDC defects.

The detection of wafers which do not meet the quality limit should also be performed as early as possible and as reliably as possible in the manufacturing process, in order to notice a possible problem in the manufacture as early as possible. One possibility for determining the wafers which possibly do not meet the quality limit (bad wafers) is the use of so-called process data. These process data are values of process parameters which are continuously recorded during the manufacturing process. Examples of process data are, for example, the pressure or the temperature in a process chamber during a process step.

According to the prior art, for detecting the bad wafers, an upper and/or lower limit value or threshold value is stored for each process parameter. The value of the process parameter (process datum) must not go above or below this limit value in the manufacturing process. According to the prior art, however, there is the problem that the number of these limit values for a wafer production installation very quickly reaches a value which is no longer manageable, since a product which is to be monitored can be manufactured by means of various operations, machines, formulations, etc. The operations, machines, formulations, etc. are referred to hereafter as hierarchical levels (i.e. a hierarchical level is for example the set of all the formulations occurring). Consequently, the number of limit values to be stored results from the number of combinations of hierarchical levels occurring in the manufacture of the wafers (i.e. the number of products produced multiplied by the number of process steps required for the production multiplied by the number of formulations per product multiplied by the number of possible machines). In a typical case with 300 products, with 20 process steps, with 10 formulations per product and with 20 possible machines, the number of limit values to be stored amounts to 1,200,000. This number is so high that the corresponding set of limit values is no longer manageable or maintainable. Consequently, monitoring of these limit values is not practically possible.

Document D1 (US 2002/0055194 A1) discloses a method for the quality monitoring of a production line, in which a trend in the quality characteristics of the production line or fluctuations are detected at an early stage.

U.S. Pat. No. 5,726,920 discloses a final-wafer-sorting (FWS) testing facility, in which raw output data that are output by means of FWS test stations are augmented with additional differentiating data to produce thereby differentiable output data which can be sorted according to a number of criteria.

C. Schneider et al., IEEE/SEMI Advanced Semiconductor Manufacturing Conference, April 2001, pages 33 to 40 discloses an automatic control of the "Critical Dimension (CD)" in a photolithographic method. For this purpose, a system which stores in a database historical settings of production tools for every combination of product, reticle, mask layer and mold combination is presented.

The invention is based on the problem of making the monitoring of process parameters of a manufacturing process simpler and more effective.

SUMMARY OF THE INVENTION

In the case of the method for the computer-aided monitoring of process parameters of a manufacturing process of a physical object, object data which characterize the physical object are assigned to various hierarchical levels, object data of various hierarchical levels are grouped to form hierarchical object data records, limit values for at least one process parameter are stored and respectively assigned to one hierarchical object data record, process data of the at least one process parameter, measured during the manufacture of physical objects, are stored and the hierarchical object data records corresponding to the object data are determined for physical objects manufactured. In the case of the method, furthermore, the process data stored for the corresponding object data records are compared with the stored limit values for the corresponding object data records; in the comparison, the hierarchical levels of the object data record of the stored process data are iteratively processed according to a predeterminable hierarchy in such a way that, starting from a highest hierarchical level, the next-lower hierarchical level is processed, and this is repeated until the processing has reached the lowest hierarchical level, and an unspecific value is stored for the hierarchical level if no specific value is stored in the object data record for a hierarchical level.

In this application, a hierarchical level is understood as meaning a hierarchical level of a manufacturing process. As described above, for example all the formulations which are used in the manufacturing process belong to the "formulation" hierarchical level, or all the machines used belong to the "machines" hierarchical level, or all the products produced belong to the "products" hierarchical level. The individual datum which is allocated to a hierarchical level is referred to as the object datum. For example, an object datum is the formulation L071F, the machine 121 or the product SFET2.

Furthermore, in this application an object data record is understood as meaning a combination of object data of various hierarchical levels. In other words, an object data record corresponds to a possible combination of the object data of the hierarchical levels which occur in the manufacturing process of a physical object. For example, an object data record corresponds to a combination of the hierarchical levels product B6HFC, which was manufactured by means of process step 2571, by means of formulation L071F and by means of machine 121.

A process parameter is to be understood in this connection as meaning a parameter of a manufacturing process of a physical object. These include, for example, in the manufacture the misalignment, i.e. the inaccuracy of the positioning of a wafer in a machine, or in other words a deviation of an actual position of the wafer in the machine from the prescribed position of the wafer in the machine, within a positioning step, the temperature during a process step, the gas flow during a process step, the time duration of a process step, the pressure prevailing during a process step, generally all valve positions, a wafer carrier speed and a wafer carrier contact pressure. Other process parameters in lithography are, for example, various alignment variables, a focusing or a dose. These process parameters are constantly recorded during the manufacturing process and are available for further use.

A hierarchical level is preferably understood as meaning a logistical level of the manufacturing process. In this application, these are preferably for example a process unit level, i.e. a work center, a product group level, i.e. a group in which the various manufactured products that are manufactured in a specific work center are differentiated, an operation level, i.e. a level in which the manufactured products are further differentiated according to the operations by means of which they are manufactured, an equipment or machine level, i.e. a level in which it is differentiated by means of which machine a specific operation is performed, and a formulation level, i.e. a level in which it is differentiated by means of which formulation a product is manufactured on a specific machine.

In the application, a differentiation is made between specific object data and unspecific object data. Specific object data are understood, for example, as meaning the object datum L071F for a formulation, 121 for a machine, or SFET2 for a product. An unspecific object datum is understood as meaning a "*". This unspecific object datum "*" is used for a hierarchical level when the object datum cannot or should not be specified any more precisely. The unspecific object datum may be understood as a kind of space-saver, which stands for all object data of a hierarchical level possible in a manufacturing process apart from those which are precisely specified for the hierarchical level.

Each object data record is understood as meaning a specific combination of object data of various hierarchical levels of the process occurring in a manufacturing process, with various object data records existing. An exactly specified object data record is an object data record in which a specific object datum is assigned for all the hierarchical levels. An unspecific object data record is an object data record in which at least one hierarchical level is assigned a specific object datum and at least one hierarchical level is assigned an unspecific object datum.

The device for the computer-aided monitoring of process parameters of a manufacturing process of a physical object has at least one processor, which is set up in such a way that the method steps described above can be carried out.

In a computer-readable storage medium, a processing program for the monitoring of process parameters of a manufacturing process of a physical object is stored, which processing program has the method steps described above when it is run by a processor.

A computer program element for the monitoring of process parameters of a manufacturing process of a physical object has the method steps described above when it is run by a processor.

The invention can be realized both by means of a computer program, i.e. software, and by means of one or more special electrical circuits, i.e. in hardware, or in any desired hybrid form, i.e. by means of software components and hardware components.

By means of the method according to the invention, the effort involved in monitoring and managing a multiplicity of limit values for the production of a physical object is greatly reduced. By using a hierarchical order of the hierarchical levels, it is possible to reduce the number of limit values to be stored to the extent that management and maintenance of the limit values is possible, and consequently monitoring of individual process parameters is also possible in the first place. In particular, the number of limit values to be stored can be drastically reduced by means of the unspecific object data. A further advantage is that new or not yet monitored products, i.e. products for which no specific limit value has been stored as yet, can be monitored by means of the use of the unspecific object data. A specific limit value is understood here as meaning a limit value for a process parameter which is assigned to an exactly specified object data record, i.e. an object data record in the case of which an unspecific object datum is not stored for a hierarchical level. Whereas, an unspecific limit value is understood as meaning a limit value for a process parameter which is assigned to a not exactly specified object data record, i.e. an object data record in the case of which an unspecific object datum is stored for at least one hierarchical level.

The physical object is preferably a wafer.

The invention is well-suited in particular in the case of wafer manufacture with its extremely high number of process steps, and consequently an extremely high number of limit values to be stored for process parameters, and very high requirements on the accuracy of the setting of the process parameters, since monitoring of process parameters in a simple manner is consequently realized for the first time in this area. The possibility of carrying out monitoring exists for the first time, since the number of limit values to be stored is reduced by means of the invention to the extent that it becomes possible to manage and maintain these limit values. In the case of a development of the method, the hierarchical levels correspond to logistical levels of the manufacturing process. According to a refinement of the method, unspecific limit values are stored for process parameters by using unspecific object data.

By means of the use of unspecific object data, it is possible to store so-called unspecific limit values for a process parameter. These unspecific limit values are not valid for an exactly specified object data record, i.e. for an object data record in which a specific object datum is stored for each hierarchical level, but for object data records for which no specific limit value is stored. It is consequently possible for example to store an unspecific limit value of a process parameter for a product, which unspecific limit value is then valid independently of the object data of individual hierarchical levels of the object data record, as long as a specific limit value is not stored for the object data record. New or not yet maintained products or new manufacturing processes, i.e. new process steps for a product, can also be monitored by means of the unspecific limit values. The values of the at least one process parameter are preferably measured. In the case of the method according to the invention, the hierarchical levels may be sorted according to the predeterminable hierarchy.

The management of limit values according to the invention can be graphically imagined in the form of a table. For managing the limit values for process parameters of an object data record in the manufacture of a physical object, a hierarchical management method is created. In table form, this involves allocating a limit value to a process parameter for each object data record, it also being possible for the hierarchical levels to be linked by unspecific object data. These unspecific object data mean that all possible values can be used at the place at which the unspecific object datum is situated, apart from the values which are specified more precisely for the hierarchical level concerned. In other words, a limit value of a process parameter for an object data record may be valid for process parameters of physical objects which have different object data. This reduces enormously the effort involved in managing and maintaining the limit values. Furthermore, the monitoring of new or not yet maintained products is also possible.

By means of preferred refinements of the invention, it is possible to reduce the effort involved in managing a multiplicity of limit values. A hierarchical management method in which the limit values are divided into hierarchical levels is created. Each of the hierarchical levels may be assigned a logistical level, such as for example a process unit, a product group, a specific machine on which the product is manufactured, or an operation. The hierarchical division can be chosen as desired, adapted to the application. This choice preferably only exists once, however, when the hierarchical management of limit values is being set up. The limit values are preferably stored in a tabular overview. The hierarchical levels are preferably arranged in the columns of the table. A lower and/or upper limit value for a process parameter for all the object data records is preferably stored in the rows of the tabular arrangement. In other words, within a row, each product is allocated a limit value for a specific parameter in a way corresponding to its manufacturing history (process steps to which it had been subjected, formulations with which it was produced, machines on which it was processed, etc.).

One advantage of the method according to the invention is, in particular, that, because of the use of unspecific object data, a limit value does not have to be stored for all possible combinations of the various hierarchical levels, i.e. object data records. As a result, the number of limit values required can be drastically reduced. The maintenance of the limit values is consequently simplified. Furthermore, according to the invention, so-called unspecific limit values can also be assigned. These unspecific limit values are limit values which are valid for object data records for which no specific limit values have been stored. In other words, for object data records in the case of which new, not yet used object data occur in a hierarchical level. In particular, these unspecific limit values relate to new products, new processing steps, new machines and/or to products for which no limit values have been stored as yet. In other words, combinations of hierarchical levels which have not so far been included in limit-value monitoring or limit-value management.

An entirely unspecific limit value may also be stored, in that all the hierarchical levels are allocated unspecific object data. If these unspecific limit values are chosen to be small, the effect is achieved that these unspecific limit values are always exceeded in production for the first time, i.e. for example first-time production of a new product, so that attention is inevitably drawn to the associated object data record and, if appropriate, new limit values can be stored for the corresponding object data record.

Even though the invention is explained in more detail below on the basis of the example of a monitoring method of a wafer manufacturing process, it is pointed out that the invention is not restricted to this but instead can be used in all monitoring methods for manufacturing processes in which process parameters are recorded in the manufacturing process for manufacturing a physical object, for example also in the pharmaceuticals industry in the manufacture of pharmaceutical products.

BRIEF DESCRIPTION OF THE DRAWINGS

An exemplary embodiment of the invention is explained in more detail below and represented in the figures, in which:

FIG. 2 shows a diagram of a chip production installation, with the complex material flow, i.e. the path of a wafer/lot, through the chip production installation and the associated complex process steps being represented;

FIG. 3 shows a block diagram in which the process data flow when manufacturing a wafer/lot is represented;

FIG. 4 shows a schematic representation of a hierarchy of limit values which is represented in the form of a tree, according to an exemplary embodiment of the invention;

FIG. 5 shows a schematic representation of a hierarchy of limit values which is represented in the form of a table, according to an exemplary embodiment of the invention.

DETAILED DESCRIPTION OF THE DRAWINGS

Figure 1:
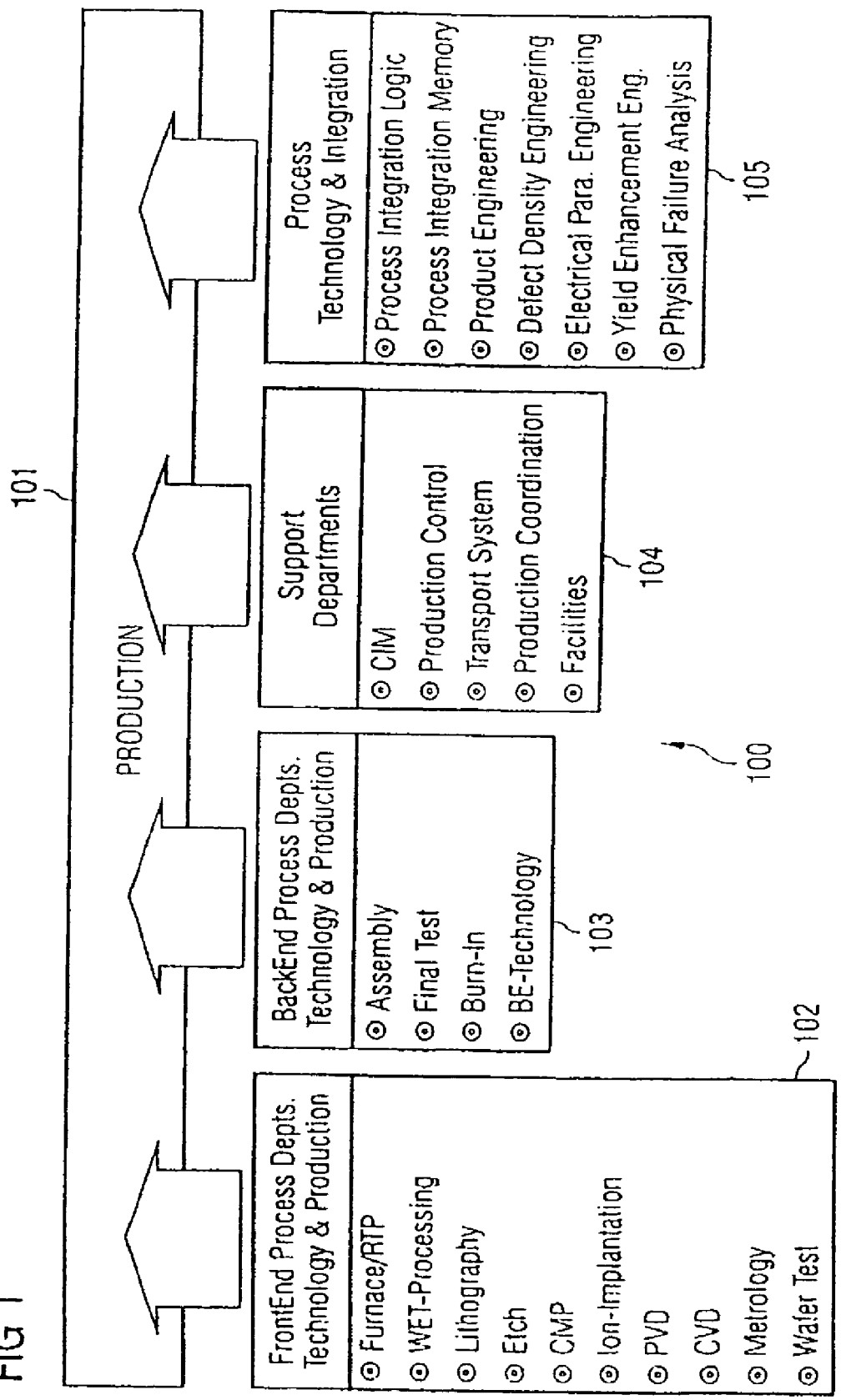
FIG. 1 shows a block diagram in which the general organization of a chip production installation is represented.

By way of introduction, FIG. 1 schematically illustrates in a block diagram 100 the organization and setup of a semiconductor chip production installation, for which a method according to the invention can be used for the monitoring of a manufacturing process of a plurality of wafers.

The overall manufacturing process, referred to in FIG. 1 by a first block 101, is grouped by way of example into four production areas 102, 103, 104, 105, a first area, into which the front-end processes of the chip production are grouped (block 102),
a second area of the manufacturing process, into which the back-end processes are grouped (block 103),
a third area of the manufacturing process, which relates to the support, that is to say the backup, of the individual manufacturing processes (block 104),
a fourth area, which relates to the process technology and the process integration (block 105).
In the case of the front-end processes 102, the following process technologies and the devices set up for carrying out the corresponding processes are provided in particular:
a furnace for heating up the respective wafer to be processed,
a device for carrying out Rapid Thermal Processing (RTP),
a device for etching the wafer, for example for wet-etching or for dry-etching,
a device for cleaning, for example washing, the wafer,
a device for carrying out various lithographic steps,
a device for chemical-mechanical polishing (CMP),
a device for carrying out an ion-implantation in predetermined areas of the wafer or of the chip respectively to be produced,
devices for applying materials to the wafer, for example devices for depositing materials from the vapor phase, that is for example devices for carrying out Physical Vapor Deposition (PVD) or Chemical Vapor Deposition (CVD), or a device for epitaxially growing material on a substrate,
metrology devices, i.e. measuring devices,
devices for carrying out tests on the respective wafers.
The back-end processes relate in particular to the following areas:
the assembly of the chips in packages,
the final test of the finished and packaged chip,
the introduction of information, for example product information, into or onto the package of the respective chip, and also
generally the technologies used in the back-end area for packaged and unpackaged chips.
The support, that is to say the process backup, relates in particular to the following areas:
CIM,
process monitoring,
a transportation system for delivering the finished semiconductor chips,
coordination of production,
backup for the respective production sites.
Process technology and process integration relates in particular to the process integration of logic chips,
the process integration of memory chips,
product engineering,
the monitoring and improving of defect densities in manufacture,
the monitoring of electrical parameters in the products manufactured,
enhancement of the yield of the chips manufactured,
a physical failure analysis.

FIG. 2 shows a semiconductor chip production installation, in other words a semiconductor chip factory 200, with a multiplicity of semiconductor chip production sub-installations 201, which are used for processing raw materials, for example a silicon wafer or a wafer made of other semiconductor materials (germanium, gallium-arsenide, indium-phosphide, etc.), in order to produce semiconductor chips from the raw materials.

A customary manufacturing process for manufacturing a semiconductor chip has hundreds of different process steps, in which lithographic steps, etching steps, CMP steps, steps for applying materials to the respective wafer to be processed, or else steps for doping or implanting doping atoms in the wafer to be processed are carried out in various sequences. In the case of all these process steps, values of process parameters are recorded and can be subjected to a later statistical analysis.

This results in the paths represented in FIG. 2 by lines 202, which represent the path of a wafer or lot through the semiconductor chip production installation 200. In the semiconductor chip production installation 200 there are a multiplicity of sensors, which are assigned to the respective production sub-installations 201 and an even greater amount of process data (raw data), which are respectively acquired by the sensors and, as explained in more detail later, processed, are recorded. A respective sensor may be integrated into a respective machine (integrated sensor) or be attached separately to a respective machine (external sensor). Hereafter, the production sub-installations 201 are also referred to as machines 201.

FIG. 3 shows by way of example the data flow for process data, which are acquired on a machine 201 by means of an integrated sensor or by means of an external sensor 301. Each sensor 301, it being possible for any desired number of integrated and/or external sensors to be provided, acquires the parameters of the machine 201 which are respectively predetermined for it, for example physical or chemical states in a process chamber, the position of a robot arm, etc. Examples of process parameters in the manufacture of a wafer are the misalignment, i.e. the positioning inaccuracy within a positioning step, the temperature during a process step, the gas flow during a process step, the time duration of a process step or the pressure during a process step.

The sensor 301 is coupled via a Semiconductor Equiptment and Material International ("SEMI") Equiptment Communication Standard ("SECS") interface 302, which is set up for data communication according to the SECS standards, to a local communication network (Local Area Network, LAN) 306.

According to the SECS standards, files are generated by the sensor 301 and the SECS interface 302 according to the PDSF format (Process Data Standard Format), also referred to hereafter as PDSF files 303 and also log files 304, the PDSF files 303 and the log files 304 being stored as data in a memory 307.

The PDSF files 303 contain, for example, analog data from different channels, that is to say from different internal (i.e. integrated) and/or external sensors 301, which may be attached to a machine 201. The process data generated are stored in the memory 307 and are subsequently available for the monitoring of the manufacturing process and the limit-value monitoring.

For monitoring the manufacturing process and the limit-value monitoring, an evaluation of the process data stored in the memory 307 is carried out by means of a computer. A method for the evaluation according to the invention is explained in the following figures.

Schematically represented in FIG. 4 is a hierarchical tree. The hierarchical tree illustrates the structure in which the process data recorded and stored in memory 307 can be stored for an evaluation by means of the computer, and are available for a computer-aided comparison with stored limit values for the process data. Presented as the highest hierarchical level of the hierarchical tree is the parameter 408, i.e. the process parameter for which a limit value is to be stored. This parameter 408 may be, for example, the misalignment, i.e. the deviation in the X and/or Y direction from a prescribed position of the wafer, which prescribed position it is intended to assume during processing. The hierarchical sequence of the hierarchical levels may be prescribed as desired, but only once at the beginning of the setting-up of the limit-value management.

According to the exemplary embodiment, the level of the work center is taken as the second hierarchical level. In FIG. 4, work center I 409 and work center II 410 are represented. These work centers identify the part of the production installation on which a relevant wafer is manufactured. The limit value for the parameter 408 of the misalignment can be stored in the exemplary embodiment for products from two work centers.

A third hierarchical level relates to different products which can be manufactured in the various work centers. In the exemplary embodiment, these are product I 411, product II 412 and product III 413, which are manufactured in the work center I 409, and for example product I' 414, which is manufactured in the work center II 410. For the sake of overall clarity, only the product I' 414 is represented for the work center II 410. In the exemplary embodiment, a limit value A is stored for the product I 411. This limit value A consequently applies in the exemplary embodiment for the parameter of misalignment of wafers of the product I 411 which were manufactured in the work center I 409.

Schematically represented as the fourth hierarchical level are various operations which are used for manufacturing the product I 411. These are operation I 415, operation II 416 and operation III 417. For the sake of overall clarity, the fourth hierarchical level for the further products 412, 413 and 414 is only indicated. This fourth hierarchical level identifies by means of which operations a specific product can be manufactured. In the exemplary embodiment, a limit value B is stored for the operation I 415, whereas no limit value is stored for the operation II 416 and operation III 417. According to a hierarchical processing of the comparison of stored limit values and associated process parameters, the following values are then obtained as limit values which must be maintained for the product I 411 for the parameter of misalignment. For a product I 411 which was manufactured according to the operation I 415 in the work center I 409, a specific limit value B is stored for the misalignment. For a product I 411 which was manufactured according to the operation II 416 or operation III 417 in the work center I, no specific limit value is stored for the misalignment.

However, a limit value which must be maintained is obtained due to the hierarchical setup. The limit value which is stored for the previous hierarchical level is obtained as the limit value. In the exemplary embodiment, this is the limit value A, which is stored for the product I 411. For the product II 412, only one operation I' 418 is schematically represented. For the sake of overall clarity, additional operations are only indicated.

On the basis of the hierarchical tree, an advantage of the method of storing limit values according to the invention is illustrated. A specific limit value does not have to be stored for all combinations of hierarchical levels in order to provide a limit value for each combination of hierarchical levels (object data record). The hierarchical setup makes it possible to reduce the number of limit values. An absent specific limit value for an object data record is substituted according to the invention by a limit value which is stored as an unspecific limit value.

In FIG. 5, a hierarchy of limit values is schematically represented in the form of a table according to the exemplary embodiment of the invention. The table illustrates an alternative structure in which the process data recorded and stored in memory 307 can be stored for an evaluation by means of the computer, and are available for a computer-aided comparison with stored limit values for the process data. The table represented is represented in a way corresponding to the lithographic process according to the invention of a wafer production installation. The production of semiconductor chips is characterized by a series of hierarchical levels. A specific product from an entirety of all the products that are in production at one time is characterized for example by means of its lot name, a technology, an operation and a formulation. Coupled with this characterization is by means of which machines, with which prescribed process parameters, the specific product has to be manufactured, and how the limit values for the predetermined process parameters are.

In the table, the individual hierarchical levels are presented in the columns. As in FIG. 4, the process parameter is used as the first hierarchical level, i.e. the first column in the table. Here, too, the parameter of misalignment is in turn represented by way of example, i.e. the parameter "misaligned" is monitored in the exemplary embodiment.

The hierarchical level "work center" is used as the second hierarchical level, i.e. the second column of the table. In FIG. 5, this is only the work center I, or in other words a group of production machines.

The third hierarchical level, i.e. the third column of the table, is the "product" which is to be monitored. For this purpose, two different products are entered in the table. The first row of the third column is marked by an "*". This asterisk signifies the entry for an unspecific value of a hierarchical level, i.e. an unspecific object datum. In the second to fourth rows, a first specific product SFET2 is entered, while in the fifth to ninth rows a second specific product B6HFC is entered. This unspecific object datum of a hierarchical level means that it stands for all possible object data that are possible, except for object data more precisely specified in the same hierarchical level.

The hierarchical level "operation" is used as the fourth hierarchical level, i.e. the fourth column of the table. Operation is understood here as meaning a process step of the manufacturing process. In the table, unspecific object data ("*") are in turn entered here in the first, second, fifth and ninth rows. Entered in the third row is the operation 6731, in the fourth row the operation 5266, in the sixth row the operation 3771 and in the seventh and eighth rows the operations 2571 and 5266.

The hierarchical level "machine" is used as the fifth hierarchical level, i.e. the fifth column of the table. In the fifth column, a specific value of 121 is entered only in the eighth row. Unspecific object data "*" are in turn entered in the first to seventh rows and in the ninth row.

The hierarchical level "formulation" is used as the sixth hierarchical level, i.e. sixth column of the table. Formulation is to be understood here as meaning the formulation by means of which the individual product is manufactured. In the sixth hierarchical level, only in the ninth row is an object datum of L071F entered. An unspecific value "*" is entered in the first to eighth rows.

The hierarchical level "layer" would be available as the seventh hierarchical level, i.e. seventh column of the table. This seventh hierarchical level is not used in the exemplary embodiment, and consequently the unspecific value "*" is entered in all the rows.

The eighth column of the table provides a lower limit value. However, a lower limit value has no meaning for the process parameter "misalignment", since it would mean a minimum misalignment, and is consequently not given any value in the table.

Finally, the ninth column of the table is available for the upper limit value of the process parameter "misalignment". Given here in the first row is a value of 2.5, in the second row a value of 8, in the third row a value of 6, in the fourth row a value of 5, in the fifth row a value of 4, in the sixth row a value of 5, in the seventh row a value of 6.5, in the eighth row a value of 4 and in the ninth row a value of 8. These values represent the upper limit values which apply for a product which had the corresponding manufacturing history, and consequently must not be exceeded. The upper limit values of the misalignment are preferably specified in relative units, for example in ppm (parts per million). They may also be specified in absolute units, such as for example μm.

On the basis of this table, it is now intended to explain by way of example the hierarchical management and the hierarchical processing in the comparison of the limit values with measured process parameters for an object data record for a number of examples.

The stored upper limit value in the first row of 2.5 is the minimum upper limit value. This applies for all the combinations not specified more precisely later in the table, and consequently also for new or not yet monitored combinations. For this reason, the limit value is also chosen to be minimal, so that with a corresponding new or not yet monitored product it is exceeded in all cases. It is consequently ensured that an alarm is immediately raised if limit values are possibly missing.

The upper limit value of 8 specified in row two applies for all object data records which are possible for a product SFET2, the product SFET2 having been manufactured in the "photo g-line", provided that a more specific upper limit value has not been stored for this product SFET2 in a later row. A more specific upper limit value is specified for example in row three for a product SFET2 which is manufactured by means of the operation 6731. For a product SFET2 which is manufactured by means of operation 6731, the upper limit value of the misalignment is 6. A further more specific upper limit value is specified in row four for a product SFET2 which is manufactured by means of the operation 5266. For a product SFET2 which is manufactured by means of operation 5266, the upper limit value of the misalignment is 5.

The upper limit value of 4 specified in row five applies in turn for all object data records which are possible for a product B6HFC, the product B6HFC having been manufactured in the "photo g-line", provided that a more specific upper limit value has not been stored for this product B6HFC in a later row. This is evident from the fact that only "*" is entered as a value in the fourth to seventh columns of the fifth row. The limit value of 4 is consequently an unspecific upper limit value for all products B6HFC which were manufactured in the work center "photo g-line".

A more specific upper limit value is specified for example in row six for a product B6HFC which is produced by means of the operation 3771. For a product B6HFC which is produced by means of operation 3771, the upper limit value of the misalignment is 5.

A further more specific upper limit value is specified in row seven for a product B6HFC which is manufactured by means of the operation 2571, or 5266. For a product B6HFC which is manufactured by means of operation 2571 or 5266, the upper limit value of the misalignment is 6.5, provided that a more specific upper limit value has not been specified.

In row eight it can be seen that a more specific upper limit value of 4 has been stored for a product B6HFC which is manufactured by means of the operation 2571 or 5266, for the case in which it is manufactured by means of the machine 121.

Finally, in the ninth row a specific upper limit value of 8 is specified for the misalignment for a product B6HFC. The limit value of 8 applies for the product B6HFC which was manufactured by the formulation L071F, provided that it is not manufactured by means of the operation 3771, 2571 or 5266.

It can be seen from the table that, according to the invention, each product can be allocated a different limit value for a process parameter, according to the manufacturing history. In this case, all possible object data records are covered, without all possible object data records being assigned a specific limit value. This is achieved in that the unspecific object data "*" are used. The hierarchical setup of the limit-value management allows the number of limit values that are to be stored, and consequently the effort involved in the monitoring of process parameters, to be drastically reduced. For instance, in a lithography installation taken by way of example, the number of 700 stored limit values is adequate to cover a number of combinations of hierarchical levels of around 340,000. This great reduction in the limit values required increases the overall clarity and maintainability of the limit-value management.

By way of example, a processing is now carried out in the comparison of measured process data with stored limit values for these process data on the basis of an example. For example, an object data record of a wafer is given by the process parameter "misaligned", the work center "photo g-line", the product "B6HFC", the operation "8641", the machine "121" and by the formulation "L071F". For carrying out the computer-aided comparison, a hierarchical processing of the individual object data is then carried out by means of a computer. As the first step, the process parameter and the work center are processed. In the table of FIG. 5, only the corresponding object data "misaligned" and "photo g-line" are considered. When processing the next hierarchical level "product", two products with specific object data are considered in the table. For product "B6HFC", the rows 5 to 9 of the table are to be processed. In the object data record of the wafer taken by way of example, a specific value has been stored for the next hierarchical level "operation" for two object data. When this object data record taken by way of example is processed, it follows that the operation 8641 is not specified in the table. Consequently, when processing the object data record taken by way of example, the rows five and nine are left over in the comparison for determining the stored limit value. These two rows five and nine of the table are also left over after processing of the next hierarchical level "machine". In the processing step of the hierarchical level "formulation", it follows that the object datum "L071F" is specified in the ninth row. It consequently follows in the hierarchical processing of the comparison that the limit value for the corresponding process parameter for the object data record taken by way of example is "8". In other words, the product which has the corresponding object data record meets the stored limit value if the misalignment is no more than "8".

Figure 6:
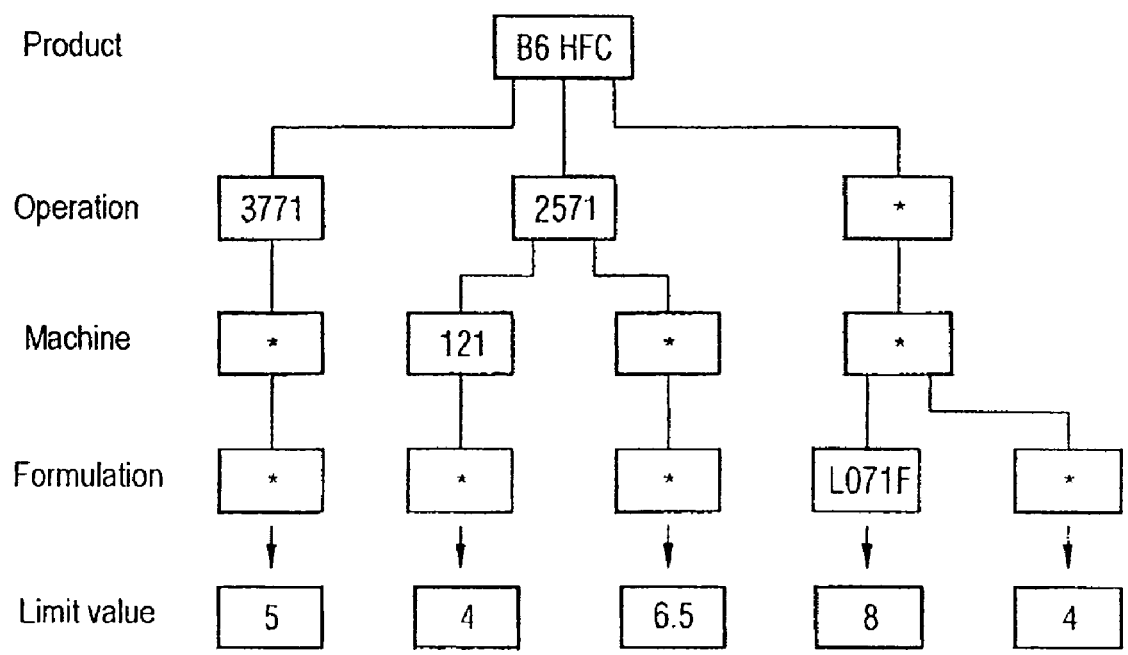
FIG. 6 shows a schematic representation of a hierarchical setup of hierarchical levels in the form of a tree, according to an exemplary embodiment of the invention.

In FIG. 6, the hierarchical setup for the product B6HFC from the table of FIG. 5 is schematically represented in the form of a tree. This setup reveals the hierarchical processing in the comparison of the measured process parameter "misalignment" with the limit values stored for the corresponding data records.

Starting from the product, firstly the next hierarchical level, i.e. all the specified operations, for this product is processed. In FIG. 6, these operations are the operation 3771, the operation 2571 and the unspecific operation "*". The operation 5266, specified further in the table of FIG. 5, has been omitted for the sake of overall clarity.

As the next step, the next hierarchical level, i.e. the specified machines, for this product is processed. Here, starting from the operation 3771, only the unspecific object datum "*" is stored. Starting from the operation 2571, the machine 121 and the unspecific object datum "*" are stored and, starting from the unspecific operation "*", only the unspecific object datum "*" is stored.

As the next step, the next hierarchical level, i.e. the specified formulations, for this product is processed. Here, starting from the unspecific datum in the branch of the operation 3771, only the unspecific object datum "*" is stored.

Starting from the machine 121, only the unspecific object datum "*" is stored. Starting from the unspecific datum in the branch of the operation 2571, only the unspecific object datum "*" is stored and, starting from the unspecific machine "*" in the branch of the unspecific operation "*", the specific formulation L071F and the unspecific object datum "*" are stored.

Consequently, the hierarchical tree represented in FIG. 6 is obtained. The individual branches of the hierarchical tree are then assigned the individual stored limit values. The individual branches at the same time represent the individual object data records. The first represented object data record (product B6HFC, operation 3771, machine "*", formulation "*") is assigned the limit value 5 for the process parameter of misalignment. The second represented object data record (product B6HFC, operation 2571, machine 121, formulation "*") is assigned the limit value 4 for the process parameter of misalignment. The third represented object data record (product B6HFC, operation 2571, machine "*", formulation "*") is assigned the limit value 6.5 for the process parameter of misalignment. The fourth represented object data record (product B6HFC, operation "*", machine "*", formulation L071F) is assigned the limit value 8 for the process parameter of misalignment and the fifth represented object data record (product B6HFC, operation "*", machine "*", formulation "*") is assigned the limit value 4 for the process parameter of misalignment. This fifth object data record at the same time represents an entirely unspecific object data record which is valid for all object data records not specified any more precisely for the product B6HFC. The limit value of 4 assigned to the fifth object data record consequently also applies to the limit-value monitoring of all the new products or not yet monitored products.

The hierarchical processing in the computer-aided comparison of measured values for process parameters and stored limit values for these process parameters is also briefly explained on the basis of the representation in FIG. 6 by way of example, on the basis of the same object data record of a wafer as above (B6HFC, 8641, 121, L071F). The object datum of the highest hierarchical level considered in FIG. 6 (product) and the object datum in the object data record taken by way of example coincide. In the hierarchical processing by means of a computer, the "operation" then comes as the next hierarchical level and it is decided in the evaluation in which branch represented in FIG. 6 the limit value being sought is to be found. Only operations 3771 and 2571 are specified in FIG. 6. Therefore, it follows for a product B6HFC which was manufactured by means of the operation 8641 that the stored limit value of the process parameter is located in the branch which is identified by means of the unspecific object datum "*". In FIG. 6, this is the branch on the far right. For the further hierarchical processing, the computer next considers the hierarchical level "machine". In the right-hand branch of the hierarchical tree represented in FIG. 6, no machine is specified, i.e. this hierarchical level in which "121" is stored in the object data record of the wafer taken by way of example does not produce any further branching of the tree for a comparison. To complete the computer-aided hierarchical processing, the hierarchical level "formulation" is also considered. Here, a formulation "L071F" is specified in the right-hand branch of the tree represented in FIG. 6. The specified object datum for the formulation coincides with the object datum "L071F" of the object data record taken by way of example. Consequently, a limit value of "8" is obtained in the hierarchical processing for the process parameter of the object data record taken by way of example.

To sum up, the invention provides a method for the monitoring of process parameters of a manufacturing process of a physical object in which the number of limit values to be stored can be drastically reduced by the limit-value management being hierarchically structured. This hierarchical structuring has the effect that a specific limit value no longer has to be stored for each combination of hierarchical levels. The method according to the invention enhances the maintainability of the limit-value management and additionally offers the possibility of allowing new products or not yet maintained products also to undergo monitoring.

The invention claimed is:

1. A method for the computer aided monitoring of process parameters of a manufacturing process of a physical object comprising:
   storing an unspecific value for a hierarchical level if no specific value is stored in an object data record corresponding to the hierarchical level;
   storing process data for at least one process parameter for a corresponding hierarchical object date record;
   comparing the stored process data with a stored limit value for the corresponding hierarchical object data record having a specific value; and
   iteratively processing the hierarchical levels of the object data record having a specific value with the stored process data from a highest hierarchical level to the next-lower hierarchical level, wherein the object data record having a specific value has object data that identifies a logistical level of the physical object, the logistical level assigned to the hierarchical level having a limit value for at least one process parameter being stored and corresponding to the hierarchical object data record.

2. The method of claim 1, wherein the physical object is a wafer.

3. The method of claim 1, wherein the hierarchical levels correspond to logistical levels of the manufacturing process.

4. The method of claim 1, wherein an unspecific limit value is stored for a process parameter by using unspecific object data.

5. The method of claim 1, wherein a value of the at least one process parameter is measured.

6. The method of claim 1, wherein the hierarchical levels are sorted according to a predeterminable sorting criterion.

7. The method of claim 1, wherein the unspecific value of the hierarchical level of the object record is used in the iteratively processing if the value of the hierarchical level is not stored as a specific value.

8. A device for the computer-aided monitoring of process parameters of a manufacturing process of a physical object, said device comprising:
a processor that is configured to carry out the following method:
storing an unspecific value for a hierarchical level if no specific value is stored in an object data record corresponding to the hierarchical level;
storing process data for at least one process parameter for a corresponding hierarchical object date record;
comparing process data stored for the corresponding object data record with a stored limit value for the corresponding object data record;
iteratively processing the hierarchical level of the object data record of the stored process data according to a predeterminable hierarchy from a highest hierachical level to a next-lower hierarchical level, and repeating the comparing and the iteratively processing until the processing has reached a lowest hierarchical level, wherein the object data record has object data that identifies a logistical level of the physical object, the logistical level assigned to the hierarchical level with a limit value for at least one process parameter being stored and respectively assigned to a hierarchical object date record.

9. The device of claim 8, wherein the unspecific value of the hierarchical level of the object record is used in the iteratively processing if the value of the hierarchical level is not stored as a specific value.

10. A computer-readable storage medium, that stores a program for monitoring a manufacturing process of a physical object, the computer-readable storage medium configured to execute the following method:
storing an unspecific value for a hierarchical level if no specific value is stored in an object data record for the hierarchical level;
storing process data for at least one process parameter for a corresponding hierarchical object data record;
comparing process data stored for the corresponding object data record with a stored limit value for the corresponding object data record;
iteratively processing the hierarchical level of the object data record of the stored process data according to a predeterminable hierarchy from a highest hierarchical level to a next-lower hierarchical lever, and repeating the comparing and the iteratively processing until the processing has reached a lowest hierarchical level, wherein the object data record has object data that identifies a logistical level of the physical object, the logistical level assigned to the hierarchical level with a limit value for at least one process parameter being stored and respectively assigned to a hierarchical object data record.

11. The computer-readable storage medium of claim 8, wherein the unspecific value of the hierarchical level of the object record is used in the iteratively processing if the value of the hierarchical level is not stored as a specafic value.

12. A computer architecture for monitoring a manufacturing process of a physical object, object data that identifies the physical object being assigned to various hierarchical levels, object data of various hierarchical levels being grouped to form hierarchical object data records, limit values for at least one process parameter being stored and respectively assigned to a hierarchical object data record, process data of the at least one process parameter, measured during the manufacture of the physical object, being stored and the hierarchical object data records corresponding to the object data being determined for the physical object manufactured, the architecture configured to perform the following method:
storing an unspecific value for the hierarchical level if no specific value is stored in the object data record for the hierarchical level;
storing process data for at least one process parameter for a corresponding hierarchical object data record;
comparing the process data stored for the corresponding object data records with the stored limit values for the corresponding object data records;
iteratively processing the hierarchical level of the object data record of the stored process data according to a predeterminable hierarchy from a highest hierarchical level to a next-lower hierarchical level, and repeating the comparing and the iteratively processing until the processing has reached a lowest hierarchical level, wherein the object data record has object data that identifies a logistical level of the physical object, the logistical level assigned to the hierarchical level with a limit value for at least one process parameter being stored and respectively assigned to a hierarchical object data record.

13. The computer architecture of claim 12, wherein the unspecific value of the hierarchical level of the object record is used in the iteratively processing if the value of the hierarchical level is not stored as a specific value.

* * * * *

UNITED STATES PATENT AND TRADEMARK OFFICE
CERTIFICATE OF CORRECTION

| | | |
|---|---|---|
| PATENT NO. | : 7,027,943 B2 | Page 1 of 1 |
| APPLICATION NO. | : 10/712418 | |
| DATED | : April 11, 2006 | |
| INVENTOR(S) | : Erwin Steinkirchner et al. | |

It is certified that error appears in the above-identified patent and that said Letters Patent is hereby corrected as shown below:

Column 16, in claim 11, line 4, before "value." delete "specafic" and substitute --specific-- in its place.

Signed and Sealed this

Twenty-seventh Day of March, 2007

JON W. DUDAS
*Director of the United States Patent and Trademark Office*